United States Patent
Saketi et al.

(10) Patent No.: US 10,522,709 B1
(45) Date of Patent: Dec. 31, 2019

(54) METHOD OF DIRECT WAFER MAPPING BY DETERMINING OPERATIONAL LEDS FROM NON-OPERATIONAL LEDS USING PHOTO-REACTIVE ELASTOMER DEPOSITION

(71) Applicant: Facebook Technologies, LLC, Menlo Park, CA (US)

(72) Inventors: Pooya Saketi, Cork (IE); Patrick Joseph Hughes, Cork (IE); David Massoubre, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/832,652

(22) Filed: Dec. 5, 2017

(51) Int. Cl.
| | |
|---|---|
| *H01L 33/00* | (2010.01) |
| *H01L 33/62* | (2010.01) |
| *H01L 33/44* | (2010.01) |
| *H01L 21/67* | (2006.01) |
| *H01L 21/68* | (2006.01) |
| *H01L 21/66* | (2006.01) |
| *H01L 25/075* | (2006.01) |
| *H01L 33/48* | (2010.01) |

(52) U.S. Cl.
CPC ...... *H01L 33/0079* (2013.01); *H01L 21/6715* (2013.01); *H01L 21/67144* (2013.01); *H01L 21/681* (2013.01); *H01L 22/20* (2013.01); *H01L 25/0753* (2013.01); *H01L 33/44* (2013.01); *H01L 33/48* (2013.01); *H01L 33/62* (2013.01); *H01L 2933/0025* (2013.01); *H01L 2933/0066* (2013.01)

(58) Field of Classification Search
CPC ............... H01L 33/62; H01L 21/67144; H01L 21/6715; H01L 21/681; H01L 22/20; H01L 25/0753; H01L 33/0079; H01L 33/44; H01L 33/48
See application file for complete search history.

(56) References Cited

U.S. PATENT DOCUMENTS

| | | | |
|---|---|---|---|
| 2015/0187839 A1* | 7/2015 | Ishiguro | H01L 25/0753 257/88 |
| 2016/0300745 A1* | 10/2016 | Chang | H01L 25/0753 |
| 2017/0358505 A1* | 12/2017 | Chang | H01L 22/22 |
| 2018/0233640 A1* | 8/2018 | Kawai | B29C 45/14 |
| 2018/0277524 A1* | 9/2018 | Moon | H01L 21/677 |

* cited by examiner

*Primary Examiner* — Michael Jung
(74) *Attorney, Agent, or Firm* — Fenwick & West LLP

(57) ABSTRACT

LEDs are manufactured on a substrate layer and picked and placed using a pick-up tool (PUT) onto a target substrate. The PUT typically attaches to an LED via an elastomer layer deposited on a surface of the LED. A given batch of manufactured LEDs may contain operational LEDs as well as non-operational LEDs. In order to separate the operational and non-operational LEDs, the LEDs are placed on a unidirectional conductive film. A photo-curable polymer is deposited on a surface of each LED. A voltage difference is applied across the electrodes of each LED via the unidirectional conductive film, causing the operational LEDs to emit light and cure the photo-curable polymer to form an elastomer layer, while the polymer deposited on the non-operational LEDs will not cure. As such, the PUT will be able to pick up the operational LEDs, while being unable to pick up the non-operational LEDs.

13 Claims, 8 Drawing Sheets

METHOD OF DIRECT WAFER MAPPING BY DETERMINING OPERATIONAL LEDS FROM NON-OPERATIONAL LEDS USING PHOTO-REACTIVE ELASTOMER DEPOSITION

BACKGROUND

The present disclosure relates to an assembly process for use in picking and placing of very small display element(s) from an initial substrate to a receiving substrate.

To populate a display with very small light emitting diodes (LEDs), such as micro-LEDs, there may be a need to transfer the LEDs from the native substrate on which they have been manufactured to a target substrate that forms part of a display, or "display substrate." Such small semiconductor devices may be assembled with a defined separation distance between them or closely packed together on the target substrate.

Because current LED manufacturing techniques do not result in perfects yields, any given batch of manufactured LEDs may contain non-operational LEDs. During assembly of the display, these non-operational LEDs should not be transferred to the display substrate.

SUMMARY

Embodiments relate to the picking and placing of semiconductor devices such as LEDs onto a target substrate using a pick-up tool (PUT). A batch of LEDs is formed on a substrate layer, which may contain operational LEDs and non-operational LEDs. In order to separate the operational from the non-operational LEDs and ensure that all LEDs placed onto a target substrate, the LEDs are placed onto a conductive surface or film. The conductive surface or film may comprise a unidirectional conductive film, such that a voltage difference can be applied to the electrodes of each LED through the film.

In one or more embodiments, a layer of photo-sensitive polymer is deposited on a light emitting surface of each of the plurality of LEDs. A voltage difference is applied across the electrodes of each LED, causing the operational LEDs to emit light and selectively cure the layers of photo-sensitive polymer. In some embodiments, the photo-sensitive polymer comprises a photo-curable polymer configured to cure when exposed to at least a threshold amount of light. As such, a cured elastomer layer on the LED is formed on each operational LED due to the light emitted from the LED curing the layer of photo-curable polymer deposited thereon. On the other hand, non-operational LEDs will not emit sufficient light to cure the photo-curable polymer to form an elastomer layer. The uncured photo-curable polymer is washed away, such that the operational LEDs will have an elastomer layer, while non-operational LEDs will not have an elastomer layer. The PUT picks up LEDs by attaching to the LEDs via the elastomer layer. As such, the PUT picks up the operational LEDs, and leaves behind the non-operational LEDs. The operational LEDs may be placed onto a display substrate, or on an intermediate carrier substrate to form a known good die of operational LEDs.

In some embodiments, picking and placing of is performed by placing electrodes of a plurality of light emitting diodes (LEDs) on a conductive surface. The top surface of each of the plurality of LEDs is coated with a layer of photo-curable polymer. A voltage difference is applied across electrodes of each of the LEDs through the conductive surface to cure layers of photo-curable polymer on operational LEDs of the plurality of LEDs by exposing the layers of the photo-curable polymer to light emitted from the operational LEDs. Layers of uncured photo-curable polymer are removed after applying the voltage across the electrodes.

In some embodiments, the top surface of each of the plurality of LEDs is coated with a photo-sensitive polymer that does not cure when exposed to at least a threshold amount of light. As such, when the voltage difference is applied across the electrodes of each of the LEDs through the conductive surface, the photo-sensitive polymer deposited on each non-operational LED is able to cure, while the photo-sensitive polymer deposited on each operational LED is unable to cure due to exposure to light emitted by the operational LED. A PUT may then be used to pick up the non-operational LEDs in order to separate the operational and non-operational LEDs.

Figure 1:
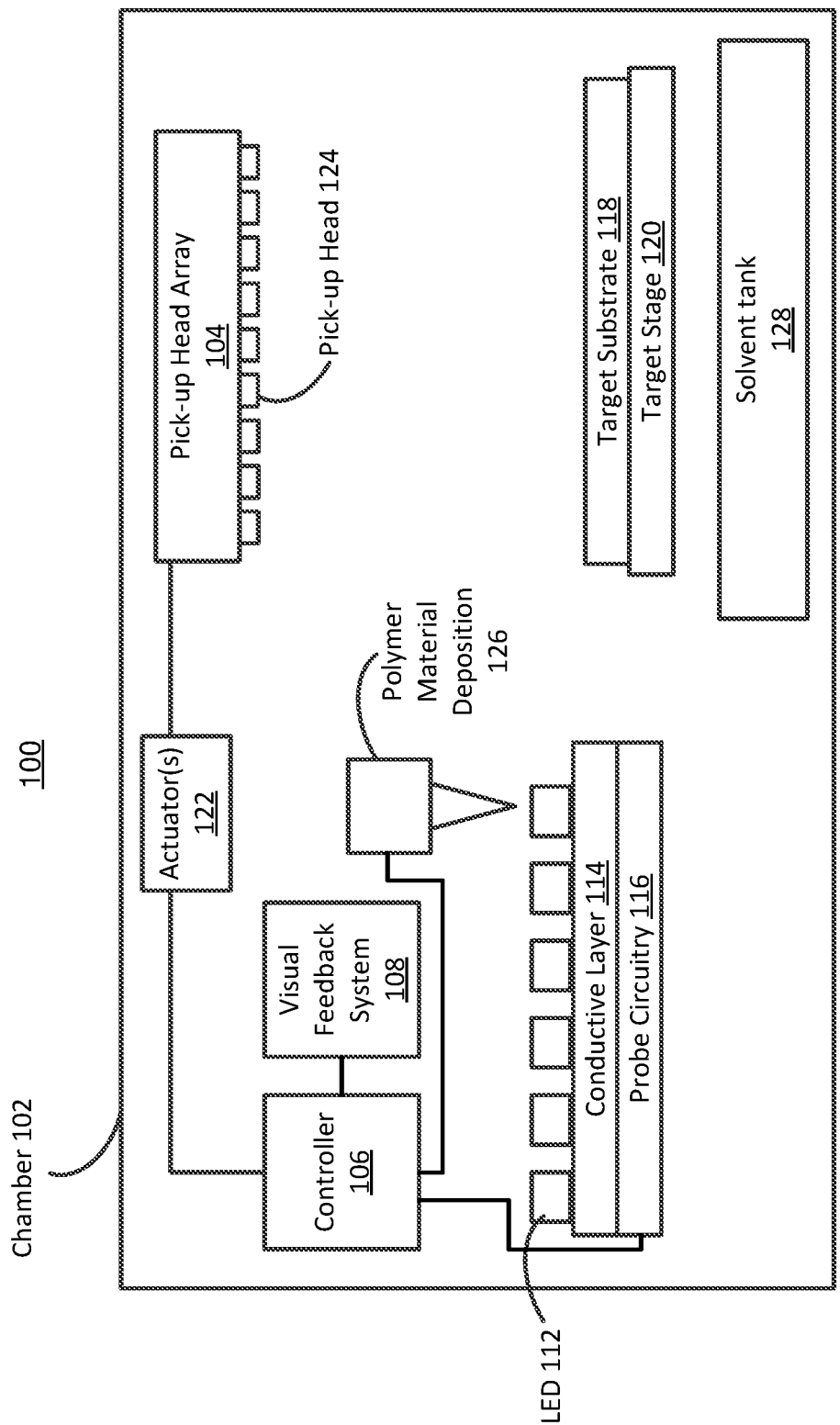
FIG. 1 is schematic diagram illustrating a display fabrication system, in accordance with one embodiment.

The figures depict embodiments of the present disclosure for purposes of illustration only.

DETAILED DESCRIPTION

Embodiments relate to the use of photo-curable polymers for the picking and placing of semiconductor devices, such as light emitting diodes (LEDs), in order to separate operation semiconductor devices from non-operational semiconductor devices. LEDs may be manufactured by forming an LED die (also referred to as an epitaxial layer) on a substrate layer (e.g., a glass or sapphire substrate). The LEDs are removed from the substrate layer and placed on an intermediate film or carrier substrate, whereupon they may be placed onto a target substrate that forms part of a display, or "display substrate." A pick-up tool (PUT) is used to pick one or more LEDs on the intermediate film or carrier substrate and place the LEDs onto the display substrate. In some embodiments, the display substrate may also be referred to as a device substrate. By using photo-sensitive polymers as an interfacing material between the LEDs and the PUT, it can be ensured that operational LEDs of the LED die can be separated from any non-operational LEDs of the LED die, to be picked up and placed on the display substrate.

As used herein, an LED is considered operational if the LED, when a given voltage difference is applied across the electrodes of the LED, emits at least a threshold amount of light. On the other hand, an LED is considered non-operational if it emits no light or emits less than the threshold amount of light when the voltage difference is applied across the electrodes of the LED.

In order to differentiate operational LEDs from non-operational LEDs, the LEDs may be placed on a conductive surface. As used herein, a conductive surface comprises a surface capable of conducting a current across a thickness of the surface but not along the width and/or length direction of the surface. As such, a voltage difference can be provided across the electrodes of each of the LEDs placed on the conductive surface (e.g., via probes placed on an opposite side of the conductive surface), causing the LEDs to emit light (if operational).

As used herein, a photo-sensitive polymer corresponds to a polymer material that cures based upon an amount of exposure to light. In some embodiments, a photo-sensitive polymer may be a photo-curable polymer, which cures only when exposed to a threshold amount of light over a designated period of time. In some embodiments, a photo-sensitive polymer may comprise a polymer material that does not cure when exposed to at least a threshold amount of light, and cures only when not exposed to light or only exposed to less than the threshold amount of light. In some embodiments, the threshold amount of light corresponds to an amount of light emitted from an operational LED.

Example System for LED Display Fabrication

In some embodiments, in order to pick and place the LEDs using a PUT, a layer of interface material is deposited on each of the LEDs. A head of the PUT contacts the interfacing material in order to pick up the LED. In some embodiments, the interfacing material comprises an elastomer material or an adhesive material.

Due to imperfections in the manufacturing process, a portion of the LEDs formed on the substrate layer may be non-operational. In order to ensure that the non-operational LEDs are not picked and placed onto the display substrate, the LEDs are placed on an intermediate film or layer that is configured such that a voltage difference can be applied across the electrodes of each of the LEDs, the voltage difference being sufficient to power the LED and cause the LED to produce light (if operational). The interfacing material deposited on each of the LEDs comprises a photo-sensitive polymer, such as a photo-curable polymer. As such, when the voltage difference is applied across the electrodes of each of the LEDs, the operational LEDs will produce light, curing the photo-curable polymer to form a layer of interfacing elastomer material. On the other hand, any non-operational LEDs will not produce sufficient light to cure the photo-curable polymer. The uncured polymer may then be removed from the surfaces of the non-operational LEDs (e.g., using a solvent).

In order to pick up the LEDs, a head of a PUT is moved towards the LEDs, such that the PUT head contacts the cured polymer interfacing material formed on the operational LEDs. However, because the non-operational LEDs do not contain a layer of cured polymer interfacing material, the PUT head does not contact and is thus unable to pick up the non-operational LEDs. As such, the PUT only picks up LEDs that are operational, and does not pick up any LEDs that are non-operational. Because the LEDs picked up by the PUT are known to be operational, they may be referred to as "known good die" or KGD.

In some embodiments, LEDs picked up by the PUT are placed directly on a display substrate. In some embodiments, the LEDs picked up by the PUT are placed on another carrier substrate to populate the substrate only with known good dies (KGD). This new substrate which has 100% yield is known as KGD wafer.

FIG. 1 is a block diagram illustrating a display fabrication system 100, in accordance with one embodiment. The system 100 fabricates a display device by assembling LEDs 112 from a conductive layer 114 to a target substrate 118. In some embodiments, subsets of the LEDs 112 emit different colored light. The conductive layer 114 may be a unidirectional conductive film that holds the LEDs 112 for pick up by the pick-up head array.

The target substrate 118 may be a display substrate, or may be an intermediate carrier substrate that facilitates bonding of the LEDs 112 with a display substrate. The system 100 places LEDs 112 at pixel locations of the display substrate, and then bonds the LEDs 112 to the display substrate. In some embodiments, the LEDs 112 are micro-LEDs, or µLEDs, having a reduced divergence of light output and small light emitting area is comparison to conventional LEDs. A µLED as described herein refers to a particular type of LED having a small active light emitting area (e.g., less than 2,000 µm$^2$). In some embodiments, a µLED may be configured to have collimated light output. The collimated light output increases the brightness level of light emitted from the small active light emitting area and prevents the spreading of emitted light into the beampath of invisible light used by light detectors and non-visible LEDs adjacent to the µLED. While the application discusses primarily µLEDs, it is understood that in other embodiments, the LEDs 112 may comprise any semiconductor device capable of emitting light.

The system 100 comprises a chamber 102 defining an interior environment for picking and placing LEDs 112 within the chamber 102. The system 100 further includes a pick-up head array 104, a visual feedback system 108, an actuator 122, probe circuitry 116, a target stage 120, and a polymer material deposition apparatus 126, within the chamber 102. The probe circuitry 116 comprises circuitry for powering the LEDs 112 through the conductive layer 114. The target stage 120 holds a target substrate 118 to receive some or all of the LEDs 112 from the conductive layer 114. A controller 106 is coupled to the visual feedback system 108, the pick-up head array 104 (e.g., via the actuator 122), the polymer material deposition apparatus 126, and the probe circuitry 116, and controls the operations of the aforementioned components. For example, the controller 106 causes the pick-up head array 104 to pick up one or more LEDs 112 located on a conductive layer 114, and place the one or more semiconductor devices on the target substrate 118.

The pick-up head array 104 may include a plurality of pick-up heads 124. Each pick-up head 124 can pick up one or more LEDs 112 from the conductive layer 114, and place the semiconductor device on the target substrate 118. After picking up one or more LEDs 112, the pick-up head 124 is aligned with a location on the target substrate 118. The pick-up head 124 is then separated from the LED 112 after placing the LED 112 at the location on the target substrate 118.

The actuator 122 is an electro-mechanical component that controls the movement of the pick-up head array 104 based on instructions from the controller 106. For example, the actuator 122 may move the pick-up head array 104, or individual pick-up heads 124, with three degrees of freedom including up and down, left and right, and forward and back. The actuator 122 may be embodied, for example, as a rotating motor, a linear motor or a hydraulic cylinder.

The visual feedback system 108 facilitates a visual alignment for semiconductor device pick-up from the conductive layer 114, and alignment for semiconductor device placement on the target substrate 118. For example, the visual feedback system 108 may generate images of the pick-up head array 104 and the conductive layer 114, and provides the images to the controller 106. The controller 106 aligns the one or more pick-up heads 124 of the pick-up head array 104 with the conductive layer 114 based on the images, and picks up one or more LEDs 112 mounted on the conductive layer 114. In another example, the visual feedback system 108 generates images of the one or more pick-up heads 124 of the pick-up head array 104 and the target substrate 118, and provides the images to the controller 106. The controller 106 aligns the one or more pick-up heads 124 with the target substrate 118 based on the images, and places the LEDs 112 attached to the one or more pick-up heads 124 on the target substrate 118. In some embodiments, the visual feedback system 108 comprises a scanning electron microscope (SEM). In other embodiments, the visual feedback system 108 may comprise an optical vision system.

In some embodiments, the visual feedback system 108 is an environmental scanning electron microscope (ESEM) to provide images without specimen coating. The chamber 102 may be an ESEM chamber including a high pressure atmosphere of water vapor. The use of an SEM may be advantageous for picking and place small semiconductor devices, such as micro-LED dies because of the SEM's ability to capture accurate images of small objects. In various embodiments, other types of imaging devices may be used to facilitate the alignments.

In some embodiments, the target stage 120 may be adjusted to facilitate precision alignment with the pick-up head array 104. For example, the target stage 120 may include three degrees of freedom. The degrees of freedom may include left and right, backward and forward, and a yaw rotational degree of freedom. The target substrate 118 is moved with the target stage 120.

In some embodiments, the LEDs 112 may have been placed on the conductive layer 114 from one or more carrier substrates (not shown). For example, different carrier substrates may carry different color LED dies.

In some embodiments, the LEDs 112 may be placed on several different carrier substrates prior to placement on the conductive film 114. For example, after the LEDs 112 are initially formed on a substrate layer (not shown), the LEDs 112 may be attached to a rigid carrier substrate and removed from the substrate layer using a laser lift-off (LLO) process. The LEDs 112 may subsequently be transferred from the rigid carrier substrate to the conductive layer 114. The conductive layer 114 may be a film or a tape that holds singulated LEDs 112 for transfer to the target substrate 118. In some embodiments, the conductive layer 114 comprises a unidirectional conductive film.

The system 100 may include one or more target substrates 118. In some embodiments, such as when the target substrate 118 is the display substrate for receiving the LEDs 112, the target stage 120 includes a heater for thermal conductive bonding of the electrical contact pads of the LEDs 112 to the target substrate 118 subsequent to placement of the LEDs 112 on the target substrate 118 by the pick-up head 104. In other embodiments, the target substrate 118 is an intermediate carrier substrate that is used to facilitate direct bonding of the LEDs 112 with a separate target substrate 118.

The polymer material deposition apparatus 126 comprises an apparatus for depositing a polymer material on a surface of one or more of the LEDs 112. In some embodiments, the polymer material comprises a photo-sensitive polymer, which the polymer material deposition apparatus 126 deposits on a light emitting surface of each of one or more of the LEDs 112. In some embodiments, the polymer material deposition apparatus 126 deposits the polymer material in the form of a fluid.

In some embodiments, the system 100 includes multiple pick-up head arrays 104 each positioned at a separate station. Each station may be dedicated to the pick and place of a particular color LED, such as a green station for green LEDs, a red station for red LEDs, and a blue station for blue LEDs, etc.

Although FIG. 1 illustrates the system 100 having a polymer material deposition apparatus 126 configured to deposit polymer material on the LEDs 112, it is understood that in other embodiments, polymer deposition may be performed outside the chamber 102. For example, in some embodiments, a spin-coating apparatus is used to spin-coat polymer onto the LEDs 100 outside the chamber 102. The spin-coated LEDs 112 may then be moved within the chamber 102 to selectively cure the deposited polymer material on the LEDs 112, such that a cured elastomer layer is formed on the LEDs of the LEDs 112 that are operational, and not on non-operational LEDs of the LEDs 112.

Example MicroLED

Figure 2A:
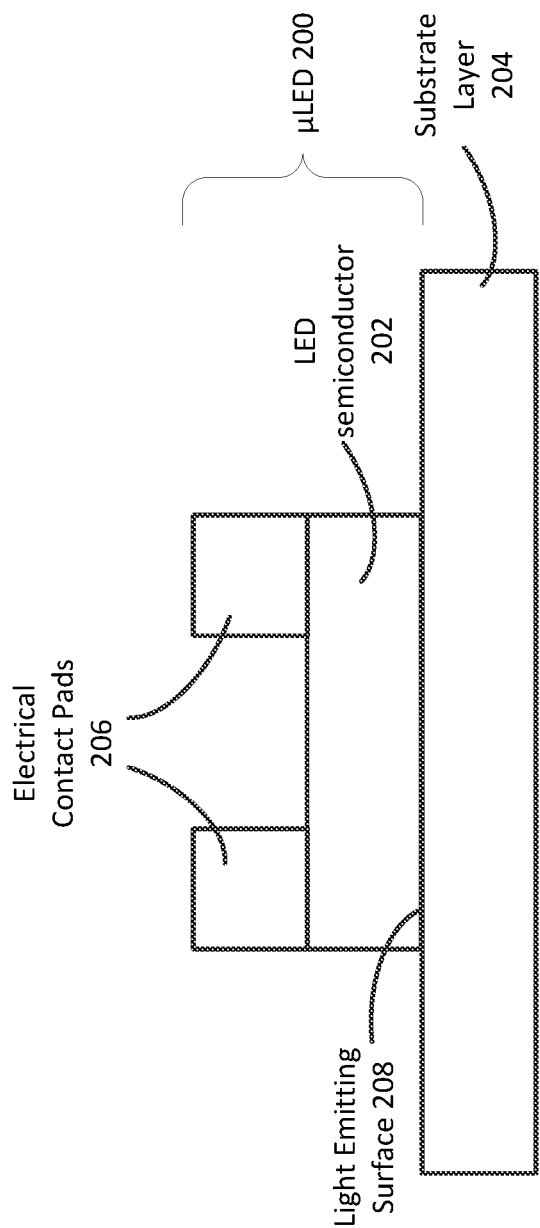
FIGS. 2A through 2C illustrates schematic diagrams of a μLED, in accordance with some embodiments.
Figure 2B:
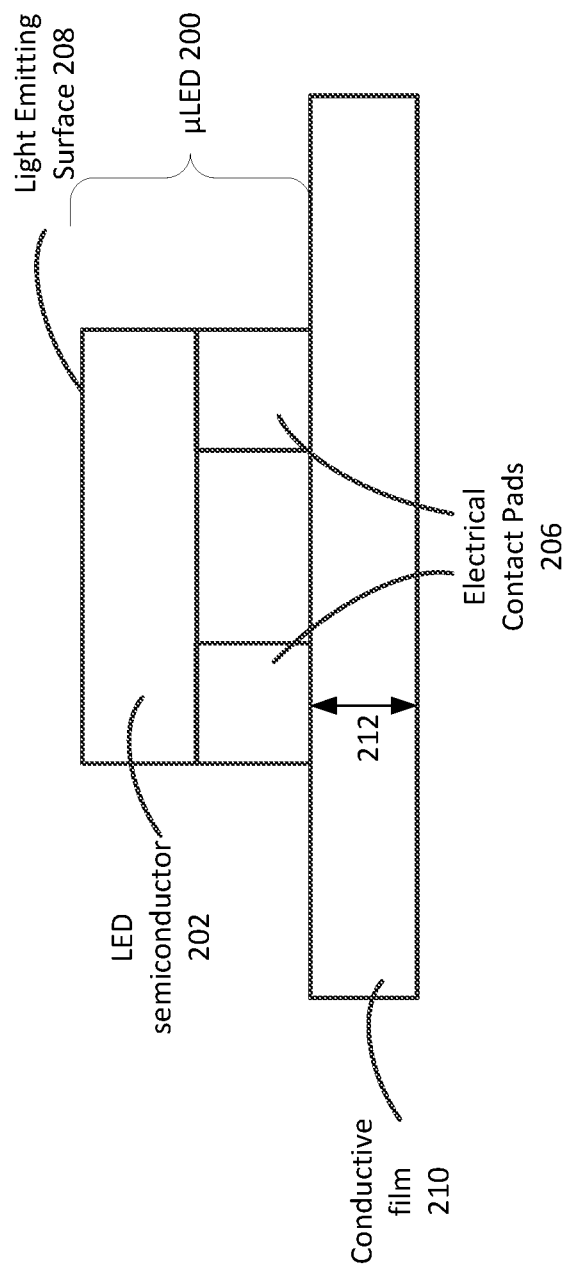
Figure 2C:
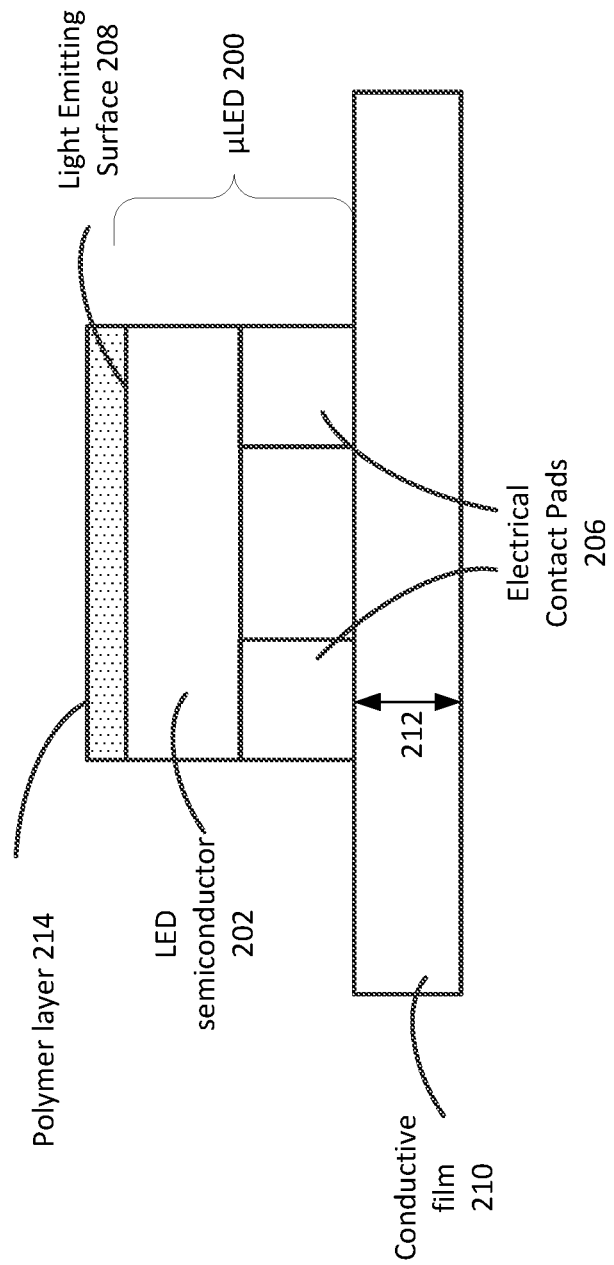

FIGS. 2A through 2C illustrate schematic diagrams of a μLED, in accordance with some embodiments. As illustrated in FIG. 2A, the μLED 200 comprises an LED semiconductor layer 202 formed on a substrate layer 204. In some embodiments, the substrate layer 204 comprises a rigid material such as glass or sapphire. In some embodiments, the LED semiconductor layer 202 comprises a gallium compound as such gallium nitride (GaN) or gallium arsenide (GaAs). The material of the LED semiconductor layer 202 and the substrate layer 204 may be different for different types of LEDs.

The μLED 200 further comprises a pair of electrical contact pads 206 (or "electrodes") formed on a surface of the LED semiconductor layer 202 not adjacent to the substrate layer 204. During operation of the μLED 200, a voltage difference is applied across the pair of electrical contact pads 206 to cause the μLED 200 to emit light from a light emitting surface 208 (which is covered by the substrate layer 204 when the μLED 200 is still attached to the substrate layer 204).

In some embodiments, the μLED 200 is removed from the substrate layer 204 using a laser lift-off (LLO) process. For example, a surface of the LED semiconductor layer 202 adjacent to the substrate layer 204 is exposed to a laser (not shown) that detaches the LED semiconductor layer 202 from the substrate layer. In some embodiments, a carrier substrate (not shown) is bonded to the μLED 200 via the electrical contact pads 206 prior to removing the substrate layer 204 using the LLO process. The carrier substrate may be a rigid substrate that holds the μLEDs formed on the substrate layer 204 in place relative to each other as the substrate layer 204 is removed.

FIG. 2B illustrates a schematic diagram of the μLED 200 removed from the substrate layer 204 and placed on the conductive film 210, in accordance with some embodiments. For example, a pick-up tool or other apparatus may simultaneously pick up a batch of μLEDs from a carrier substrate and place the μLEDs onto the conductive film 210. The μLED 200 contacts the conductive film 210 via the electrical contact pads 206. In some embodiments, the conductive film 210 comprises a flexible film that is stretched such that the surface of the conductive film 210 is flat and taut.

The conductive film 210 is unidirectionally conductive. That is, the conductive film 210 is conductive across a thickness of the film (illustrated in FIG. 2B as the vertical direction 212) but not conductive along the width and/or length direction. As such a current supplied to one side of the conductive film 210 is conducted to the opposite side of the conductive film 210 (e.g., from bottom to top or vice versa), but is not conducted along the lateral length, width or surface of the conductive film 208 (e.g., horizontal direction in FIG. 2B).

FIG. 2C illustrates a schematic diagram of the μLED 200 with a polymer layer 214, in accordance with some embodiments. In order to pick and place the μLED 200, the polymer layer 214 is deposited on a surface of the μLED 200 (e.g., on the light emitting surface 208 of the μLED 200). In some embodiments, the polymer material 214 is deposited by a polymer material dispenser (e.g., the polymer material deposition apparatus 126 illustrated in FIG. 1) in the form of a fluid, and then cured or otherwise solidified to form the polymer layer 214.

In some embodiments, the polymer layer 214 on the surface of the μLED 200 may have at least a predetermined thickness. A head of a pick-up tool (PUT) (not shown) can attach to the μLED 200 by being lowered to within the predetermined thickness from the surface of the μLED 200, such that the PUT head contacts the polymer layer 214 on the μLED 200. The polymer layer 214 may be an elastomer or adhesive layer able to attach to the PUT head, allowing the PUT head to pick up the μLED 200 and move the μLED 200 to another location (e.g., to a target substrate).

Selective Pick and Place Mechanism

Current manufacturing techniques for μLEDs are generally not able to guarantee perfect yield. As such, for any given batch of manufactured μLEDs, one or more μLEDs within the batch may be non-operational. A μLED is considered operational if the μLED, when a given voltage difference is applied across the electrodes of the μLED, emits at least a threshold amount of light. On the other hand, a μLED is considered non-operational if it emits no light or emits less than the threshold amount of light when the voltage difference is applied across the electrodes of the μLED.

Figure 3A:
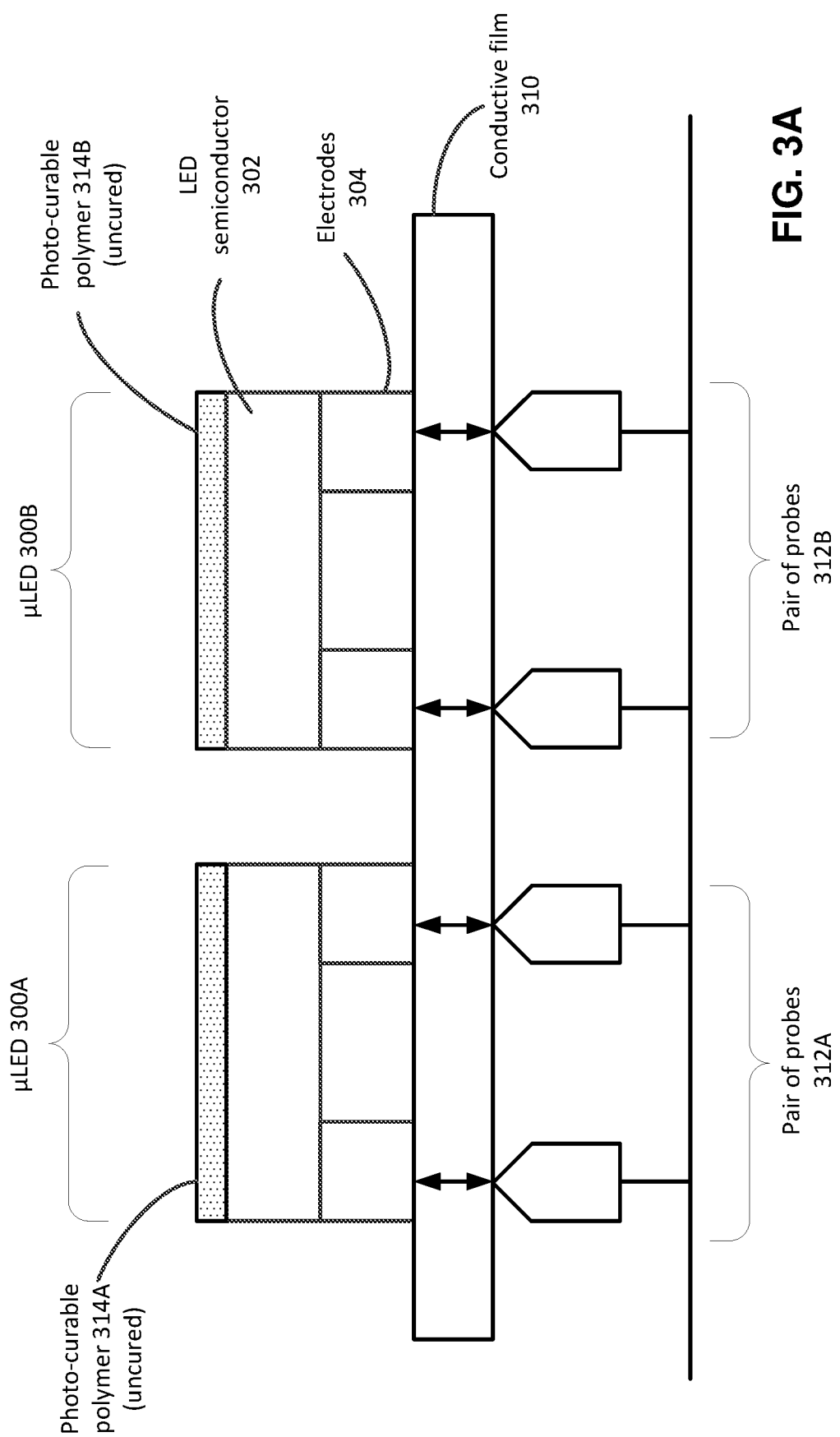
FIGS. 3A through 3C illustrate schematic diagrams of using a photo-curable polymer material for selectively picking and placing μLEDs, in accordance with some embodiments.
Figure 3B:
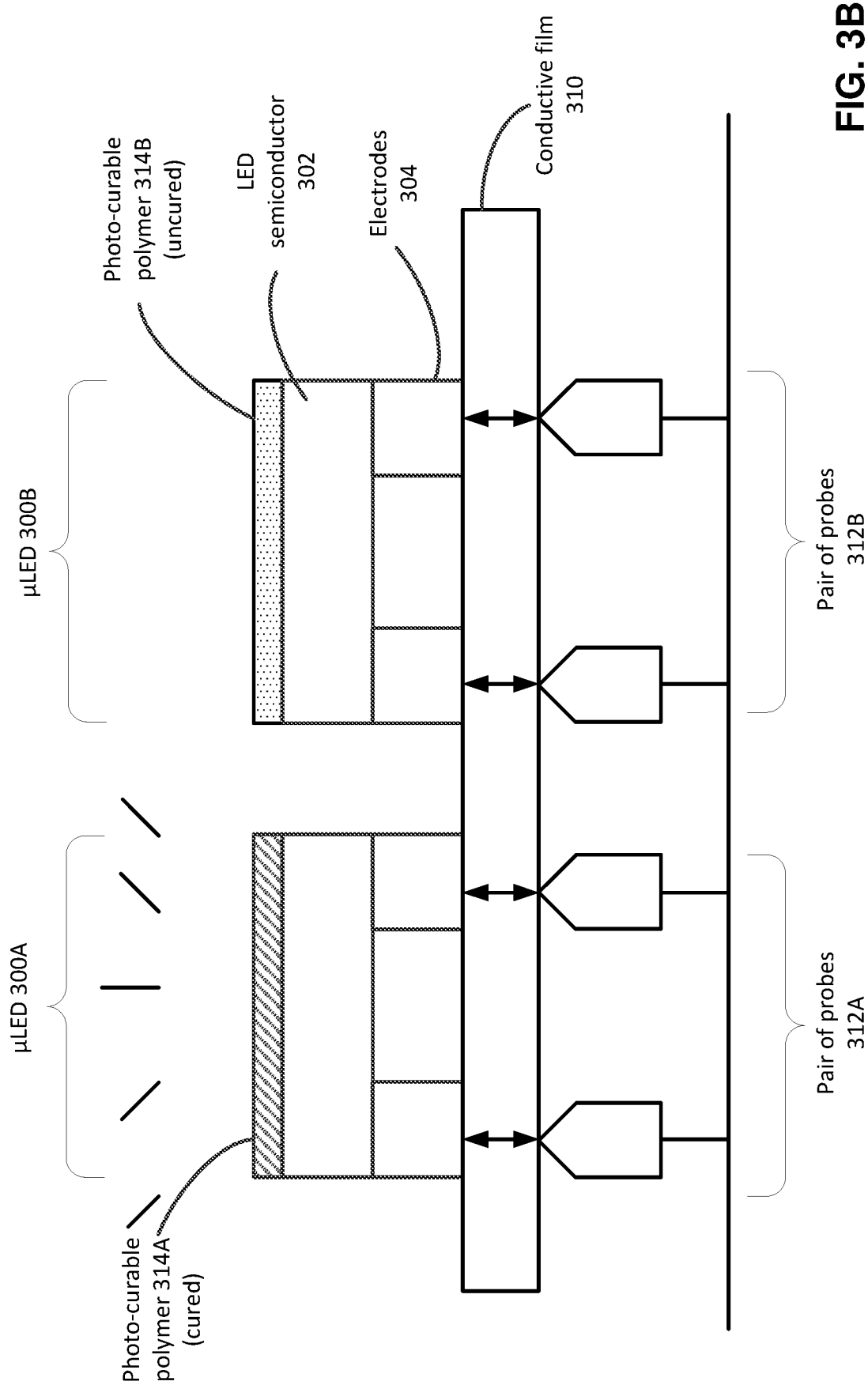
Figure 3C:
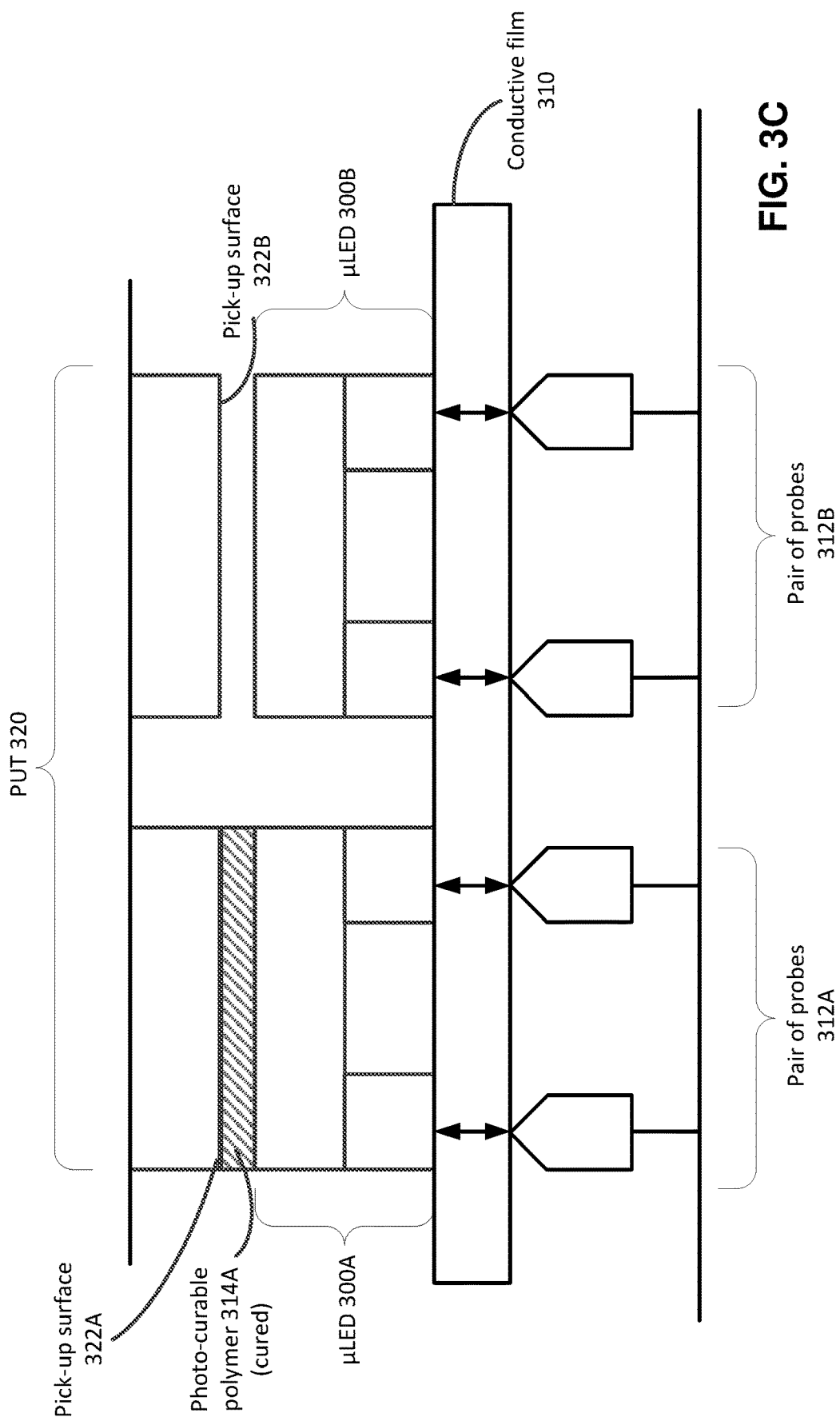

FIGS. 3A through 3C illustrate schematic diagrams of using a photo-curable polymer material for selectively picking and placing μLEDs, in accordance with some embodiments. As illustrated in FIG. 3A, a plurality of μLEDs 300 are placed on a conductive film 310 (e.g., a first μLED 300A and a second μLED 300B). Each μLED 300 comprises an LED semiconductor 302 and a pair of electrodes 304 which contact a surface of the conductive film 310 (illustrated in FIG. 3A as the upper surface of the conductive film 310).

One or more pairs of probes 312 (e.g., a first pair 312A and a second pair 312B) are positioned on a surface of the conductive film 310 opposite from locations where the electrodes 304 of the μLEDs 300 are placed. The pairs of probes 312 may form a portion of the probe circuitry 116 illustrated in FIG. 1. Each pair of probes 312 is placed corresponding to the electrodes 304 of a corresponding μLED 300, and can be powered to operate the corresponding μLED 300 on the opposite side of the conductive film 310. For example, a voltage difference may be applied across each pair of probes 312 for a predetermined time period, which causes transmission of a current across the thickness direction of the conductive film 310 to power each of the μLEDs.

A layer of photo-curable polymer 314 is deposited on a surface of each of the μLEDs 300 (e.g., on a light-emitting surface of each of the μLEDs 300). The photo-curable polymer comprises an adhesive or elastomer material that, when cured, can be used to attach the μLED 300 upon which it is deposited to the head of a pick-up tool. The polymer may be selected to cure only when certain conditions are met, such as being exposed to light of a certain frequency range (e.g., a frequency range corresponding to the μLEDs 300) for at least a threshold period of time, light of at least a threshold brightness level for at least a threshold period of time, and/or the like.

In some embodiments, as illustrated in FIG. 3A, a separate layer of photo-curable polymer 314 is deposited on each of the μLEDs 300. For example, a first layer of photo-curable polymer 314A is deposited on the first μLED 300A, and a second layer 314B deposited on the second μLED 300B. In other embodiments, a sheet of uncured photo-curable polymer may be laid over the surfaces of a plurality of μLEDs (e.g., a single sheet of uncured photo-curable polymer covering both μLEDs 300A and 300B).

In FIG. 3B, a voltage difference is applied across each of the pairs of probes 312. As a result of the applied voltage signal, current is transmitted across the thickness of the conductive film 310 to power each of the respective μLEDs 300. The voltage difference is configured to be sufficient to power each of the μLEDs 300 to emit light at or above a threshold amount (if operational).

As discussed above, for a given batch of manufactured μLEDs, one or more of the μLEDs may be non-operational. For example, as illustrated in FIG. 3B, the first μLED 300A is operational, while the second μLED 300B is non-operational. As such, when the voltage difference is applied across each of the pairs of probes 312A and 312B, the μLED 300A will emit light at a level sufficient to cure the layer of photo-curable polymer 314A deposited on the surface of the μLED 300A. On the other hand, the μLED 300B will not emit light, or only emit light below a level sufficient to cure the layer of photo-curable polymer 314B deposited on the surface of the μLED 300B.

As the μLED 300A emits light, the layer of photo-curable polymer 314A will cure to form a cured polymer layer on the μLED 300A. On the other hand, because the μLED 300B is non-operational and does not emit light at a sufficient level, the layer of photo-curable polymer 314B remains uncured. In some embodiments, the layer of photo-curable polymer 314B may partially cure, but at an amount such that any cured layer of polymer on the μLED 300B will have a thickness less than that of the cured polymer layer on the μLED 300A.

The voltage difference is applied across the pairs of probes 312 for a designated period of time sufficient for substantially all of the photo-curable polymer layers deposited on operational μLED (e.g., the layer of photo-curable polymer 314A on the μLED 300A) to be cured, forming a cured polymer layer of at least a threshold thickness over the operational μLEDs. Because each of the non-operational μLEDs does not emit light at a sufficient level to cure the layer of photo-curable polymer deposited thereon, each of the non-operational μLEDs (e.g., μLED 300B) will not have a cured polymer layer of at least the threshold thickness formed on their respective surfaces.

After the voltage difference has been applied across the pairs of probes 312 for at least the designated period of time, any uncured photo-curable polymer remaining on the surface of the μLEDs is washed off or otherwise removed (e.g., using a solvent). For example, FIG. 3C illustrates the μLEDs 300 after the uncured polymer has been removed, leaving a cured polymer layer 314A on the surface of the μLED 300A, but no polymer on the surface of the μLED 300B. In other embodiments, the uncured photo-curable polymer is not removed from the surfaces of the μLEDs. However, the uncured polymer material may not have sufficient adhesiveness allowing for the underlying μLEDs to be picked up by a PUT.

A pick-up tool (PUT) head 320 may be used to pick and place the μLEDs 300. In some embodiments, the PUT head 322 comprises multiple pick-up surfaces 322 (e.g., pick-up surfaces 322A and 322B) for picking up multiple μLEDs at once. In other embodiments, the PUT head 320 comprises a single pick-up surface 322, which is moved over different locations to pick up different μLEDs.

The PUT head 320 is operated to move the pick-up surfaces 322 to within a threshold distance of each of the μLED 300, such that the pick-up surfaces 322 comes within a certain proximity of the cured polymer layer 314 formed on the surface of the μLED 300, if one exists. For example, the first pick-up surface 322A is able to be moved to a position such that the cured polymer layer 314A formed on the μLED 300A is able to form an adhesive or elastomeric bond with the pick-up surface 322A, allowing the PUT head 320 to pick up and move the μLED 300A to a destination location, such as a display substrate or an intermediate carrier substrate.

However, the second pick-up surface 322B does not come within proximity of a cured polymer layer on the μLED 300B, as the μLED 300B, being non-operational, did not cause a cured polymer layer to form on its surface when powered through the probes 314B. As such, the PUT head 320 is unable to pick up the μLED 300B.

By placing manufactured μLEDs onto a conductive surface such that they can be powered, and using the light generated by the operational μLEDs to cure a photo-curable polymer layer for attachment to a PUT head, the operational and non-operational μLEDs in a given batch of μLEDs can be identified and separated. The operational μLEDs may be moved directly onto a display substrate, or placed onto an intermediate carrier substrate to form a known good die, where every μLED on the substrate has been determined to be operational, while the non-operational μLEDs are left behind and not picked up.

In an alternate embodiment, instead of depositing a photo-curable polymer layer on each of the μLEDs, a photo-sensitive polymer material that does not cure when exposed to light may be used. As such, when the μLEDs are powered by providing a voltage difference across each corresponding pair of probes, a cured polymer layer is formed on each non-operational μLED instead of on each operational μLED. This allows for the PUT to pick and remove each of the non-operational μLEDs, leaving behind only the operational μLEDs. As such, the remaining μLEDs on the conductive film will be 100% operational, forming a known good die of operational μLEDs. A different polymer or elastomer layer may then be formed on each of the remaining operational μLEDs for picking and placing by the PUT.

Process Flow

Figure 4:
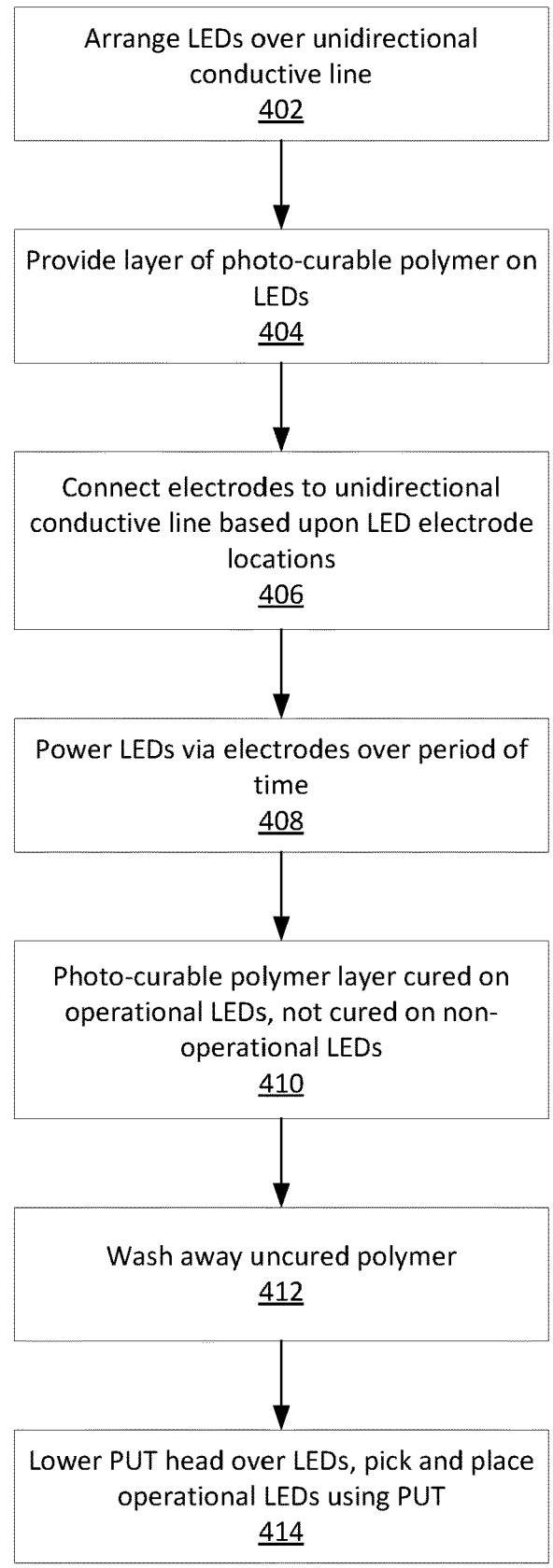
FIG. 4 illustrates a flowchart of a process for selectively picking and placing LEDs, in accordance with some embodiments.

FIG. 4 illustrates a flowchart of a process for selectively picking and placing LEDs, in accordance with some embodiments. A plurality of LEDs are arranged 402 over a unidirectional conductive line. In some embodiments, the unidirectional conductive line comprises a conductive film or tape that is conductive in the direction corresponding to the thickness of the film or tape. The film or tape may be stretched such that the unidirectional conductive line remains substantially flat. In some embodiments, the plurality of LEDs comprise μLEDs formed on a substrate layer (e.g., a glass or sapphire substrate) that have been separated from the substrate layer (e.g., through an LLO process), and transferred onto the unidirectional conductive line (e.g., via one or more carrier substrates). Each of the LEDs comprises at least a pair of electrodes in contact with the unidirectional conductive line.

A polymer material deposition apparatus deposits 404 a layer of photo-sensitive polymer (e.g., a photo-curable polymer) on a surface of each of the plurality of LEDs. The photo-curable polymer may comprise any type of polymer curable by exposure to light and having elastic or adhesive properties when cured, allowing the cured polymer to be used to attached the LED on which the polymer is deposited to a pick-up head of a PUT for pick and placement. The surface of each of the LEDs onto which the photo-curable polymer is deposited may correspond to a light-emitting surface of the LED.

A plurality of probes are connected 406 to the unidirectional conductive line based upon the locations of the LED electrodes on the unidirectional conductive line. The plurality of probes may comprise pairs of probes, each pair of probes connected to a location on a surface of the unidirectional conductive line opposite from a pair of electrodes of a corresponding LED.

A voltage difference is applied 408 across each of the plurality of probes to power each of the plurality of LEDs through the unidirectional conductive film. Due to imperfect yields of the LED manufacturing process, not all of the plurality of LEDs may be operational. When the voltage difference is applied to the probes, operational LEDs of the plurality of LEDs will emit light, while non-operational LEDs will not emit light. In some embodiments, an LED may be considered non-operational if it emits less than a threshold amount of light when powered.

The photo-curable polymer layer deposited on the LEDs cures 410 on the operational LEDs, while remaining uncured over the non-operational LEDs. In some embodiments, the LEDs are powered (e.g., by applying the voltage difference across each of the LEDs) for a period of time sufficient to allow the light emitted by each operational LED to cure at least a predetermined amount of the photo-curable polymer deposited on the light-emitting surface of the LED. As such, if a given LED of the plurality of LEDs is operational, then at least a predetermined amount of the layer of photo-curable polymer deposited on the surface of the LED will be cured. On the other hand, if the LED is non-operational, then the photo-curable polymer layer will not be cured, or less than a predetermined amount will be cured.

The uncured polymer is washed 412 from the surface of the LEDs. In some embodiments, the uncured polymer is washed away using a solvent, such as cyclohexane or toluene. Because a predetermined amount of the polymer will have been cured on the surface of each of the operational LEDs, each operational LED will have a layer of cured polymer material of at least a threshold thickness disposed on the light-emitting surface of the LED, while each non-operational LED will not have a layer of cured polymer material of at least the threshold thickness.

A head of a PUT is lowered 414 over one or more of the LEDs and used to pick and place the operational LEDs. For example, the PUT head may be lowered to within a threshold distance of one or more LEDs, such that LEDs having a cured polymer layer (e.g., operational LEDs) are attached to the PUT head, while LEDs not having a cured polymer layer (e.g., non-operational LEDs) are not attached to the PUT head. As such, the PUT head will only be able to pick up operational LEDs, and not non-operational LEDs. In some embodiments, the picked up LEDs are placed onto a display substrate to form a portion of a display. In other embodiments, the LEDs are placed onto an intermediate carrier substrate to form a known good die of LEDs, wherein each LED placed on the substrate is known to be operational.

While FIG. 4 describes a process using a photo-curable polymer, it is understood that in other embodiments, a photo-sensitive polymer that cures only when not exposed to above a threshold amount of light may be used. As such, when the LEDs are powered by providing a voltage difference across each corresponding pair of probes, only non-operational LEDs of the LED die will have a cured polymer layer formed thereon. This allows for the PUT to pick and remove each of the non-operational LEDs, leaving behind only the operational LEDs, which may then be picked and placed separately.

By operating each a plurality of LEDs to emit light to cure a photo-sensitive polymer deposited on each LED, operational and non-operational LEDs can be differentiated, such that only operational LEDs are picked and placed using the PUT. This allows for known good die of LEDs to be assembled, and for LEDs displays to be constructed using only LEDs known to operational.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method, comprising:
   placing electrodes of a plurality of light emitting diodes (LEDs) on a conductive surface;
   coating a top surface of each of the plurality of LEDs with a layer of photo-sensitive polymer, the photo-sensitive polymer being a photo-curable polymer configured to cure in response to being exposed to at least a threshold amount of light;
   applying a voltage difference across electrodes of each of the plurality of LEDs through the conductive surface to selectively cure layers of photo-sensitive polymer on the plurality of LEDs based upon light emitted by operational LEDs of the plurality of LEDs, such that layers of photo-sensitive polymer deposited on operational LEDs of the plurality of LEDs are cured due to exposure to light emitted from the operational LEDs, and the layers of photo-sensitive polymer deposited on non-operational LEDs of the plurality of LEDs remain uncured; and
   removing layers of uncured photo-curable polymer from the plurality of LEDs after applying the voltage across the electrodes.

2. The method of claim 1, further comprising approaching a pick-up head towards at least one of the plurality of LEDs to attach at least one of the operational LEDs to the pick-up head via a cured layer of photo-sensitive polymer corresponding to the at least one of the operational LEDs.

3. The method of claim 2, further comprising moving the pick-up head towards a display substrate to place the at least one of the operational LEDs on the display substrate.

4. The method of claim 1, wherein the conductive surface is part of a unidirectional conductive film that transmits current in a thickness direction of the unidirectional conductive film.

5. The method of claim 4, further comprising aligning sets of probes at an opposite surface of the unidirectional conductive film so that each set of probes is located at an opposite side of electrodes of a corresponding LED before applying the voltage difference across the electrodes, and wherein the voltage difference is applied across the electrodes by applying a voltage signal across each set of probes.

6. The method of claim 1, wherein the layers of uncured photo-curable polymer are removed by washing away the uncured photo-curable polymer using a solvent.

7. The method of claim 1, further comprising:
   forming the plurality of LEDs on a substrate; and
   transferring the plurality of LEDs from the substrate to the conductive surface.

8. A method, comprising:
   placing electrodes of a plurality of light emitting diodes (LEDs) on a conductive surface;
   coating a top surface of each of the plurality of LEDs with a layer of photo-sensitive polymer corresponding to a material that remains uncured when exposed to at least a threshold amount of light;
   applying a voltage difference across electrodes of each of the plurality of LEDs through the conductive surface to selectively cure layers of photo-sensitive polymer on the plurality of LEDs based upon light emitted by operational LEDs of the plurality of LEDs, such that layers of photo-sensitive polymer deposited on operational LEDs of the plurality of LEDs remained due to exposure to light emitted from the operational LEDs, and the layers of photo-sensitive polymer deposited on non-operational LEDs of the plurality of LEDs are cured; and
   removing layers of uncured photo-curable polymer from the plurality of LEDs after applying the voltage across the electrodes.

9. The method of claim 8, further comprising approaching a pick-up head towards at least one of the plurality of LEDs to attach at least one of the non-operational LEDs to the pick-up head via a cured layer of photo-sensitive polymer corresponding to the at least one of the operational LEDs.

10. The method of claim 9, further comprising moving the pick-up head towards a display substrate to place the at least one of the operational LEDs on the display substrate.

11. The method of claim 8, wherein the conductive surface is part of a unidirectional conductive film that transmits current in a thickness direction of the unidirectional conductive film.

12. The method of claim 11, further comprising aligning sets of probes at an opposite surface of the unidirectional conductive film so that each set of probes is located at an opposite side of electrodes of a corresponding LED before applying the voltage difference across the electrodes, and wherein the voltage difference is applied across the electrodes by applying a voltage signal across each set of probes.

13. The method of claim 8, wherein the layers of uncured photo-curable polymer are removed by washing away the uncured photo-curable polymer using a solvent.

* * * * *